(12) United States Patent
Nishio et al.

(10) Patent No.: US 6,624,570 B1
(45) Date of Patent: Sep. 23, 2003

(54) ELECTROLUMINESCENT DISPLAY DEVICE AND METHOD FOR ITS FABRICATION

(75) Inventors: Yoshitaka Nishio, Hirakata (JP); Junichi Sano, Ogaki (JP); Hisakazu Takahashi, Nishinomiya (JP); Tatsuro Usuki, Osaka (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 185 days.

(21) Appl. No.: 09/677,051

(22) Filed: Sep. 29, 2000

(30) Foreign Application Priority Data

Sep. 29, 1999  (JP) ............................................ 11-277213
Sep. 29, 1999  (JP) ............................................ 11-277214

(51) Int. Cl.$^7$ ................................................. H01J 1/62
(52) U.S. Cl. ...................... 313/506; 313/498; 313/500; 313/505; 313/512; 428/917
(58) Field of Search ................................. 313/483, 495, 313/498, 500, 505, 512, 506, 509; 445/23, 24; 428/917; 345/45, 76

(56) References Cited

U.S. PATENT DOCUMENTS

| | | | | |
|---|---|---|---|---|
| 4,138,620 A | * | 2/1979 | Dickson | ........................ 313/1 |
| 5,013,967 A | * | 5/1991 | Hirotaka et al. | ............. 313/512 |
| 5,655,940 A | * | 8/1997 | Hodson et al. | ................ 445/24 |
| 5,867,236 A | * | 2/1999 | Babuka et al. | ................. 349/73 |
| 5,889,568 A | * | 3/1999 | Seraphim et al. | ............. 349/73 |
| 6,181,405 B1 | * | 1/2001 | Izumi | ......................... 349/153 |
| 6,370,019 B1 | * | 4/2002 | Matthies et al. | ............ 361/681 |

* cited by examiner

Primary Examiner—David V. Bruce
Assistant Examiner—Jurie Yun
(74) Attorney, Agent, or Firm—W. F. Fasse; W. G. Fasse

(57) ABSTRACT

An electroluminescent display device is increased in size by securing plural small-size panels, each incorporating plural electroluminescent elements, to a large-size support with an intervening adhesive layer.

41 Claims, 9 Drawing Sheets

ELECTROLUMINESCENT DISPLAY DEVICE AND METHOD FOR ITS FABRICATION

BACKGROUND OF THE INVENTION

1. Field of the Invention

The present invention relates to an electroluminescent display device (hereinafter referred to as an "EL display device") and more particularly to a large surface-area EL display device.

2. Description of Related Art

With the recent advent of diversified information processing units, there is an increasing need for flat display elements which consume less electricity and have less weight compared to generally-employed CRTs. An EL element has received notice as one type of such flat display elements. The EL elements are generally classified into two categories depending upon the materials used: inorganic EL elements and organic EL elements.

The inorganic EL elements include a luminescent portion which emits light when its luminous centers are excited by bombardment of electrons accelerated in the intense electric field applied.

On the other hand, the organic EL elements utilize the fluorescent emission of an organic molecule that occurs when it returns toga ground state from an excited state upon recombination of an electron from an electron injecting electrode with a hole from a hole injecting electrode at its luminous center.

If the inorganic EL elements are to be driven, a high voltage in the range of 100–200 V must be applied to produce an intense electric field. In contrast, the organic EL elements can be driven at a lower voltage in the approximate range of 5–20 V. Another advantage is that the suitable selection of luminophors results in different color emissions of the organic EL elements, which makes them suitable for use in multi-color and full-color display devices.

These EL elements have excellent features distinguished from liquid crystal displays, such as spontaneous emissions, independence of view angle and thickness reduction resulting from elimination of a back light, and their applications on large surface-area display devices have been energetically researched and developed.

A variety of modes have been investigated for driving display devices utilizing such EL elements, as similar with the case of liquid crystal displays. A driving mode utilizing a TFT or other switching element positioned in each pixel has gained attention for its higher contrast ratio and middle tone characteristics. In the case of organic EL elements which are current-driven light emitting elements, a current of about 20–30 mA must be supplied to each pixel. It is difficult to realize such a current level with the use of a cell array or driver circuit constructed using amorphous silicon TFT. This necessitates a cell array or driver circuit constructed using polycrystalline silicon TFT. Silicon, when deposited on a glass substrate or the like, must be crystalized at a low temperature. That is, the use of low-temperature polycrystalline silicon TFT as a switching element becomes necessary.

It is however difficult to deposit, in the form of a uniform film, the low-temperature polycrystalline silicon on a large surface-area substrate. This has been one of barriers to area expansion of organic EL display devices.

SUMMARY OF THE INVENTION

A first object of the present invention is to provide an EL display device, such as an organic EL display device, which has a sufficient structural strength and can be fabricated in a large size.

A second object of the present invention is to provide a process for fabrication of an EL display device, which enables size increase of EL display devices if incorporating circuits (e.g., switching circuits) that are unsuited for large surface-area formation.

The EL display device in accordance with a first aspect of the present invention is characterized as being increased in size by securing plural small-size panels, each carrying plural EL elements on its substrate, to a large-size support by an adhesive layer which faces toward those EL elements.

The EL elements are known as having a tendency to deteriorate when exposed to moisture, and thus require a sealing metallic form, called a can, or the like which is attached in such a fashion to seal them from an ambient environment. In the first aspect, plural small-size panels are secured to a large-size support by an adhesive layer which faces toward those EL elements. This measure used to increase sizes of EL display devices serves not only as a sealing means for preventing the aforementioned deterioration but also as a reinforcing means for sustaining the strength of the display devices. Therefore, the first aspect simultaneously achieves sealing of the EL elements, reinforcement and size increase of the display devices.

In the first aspect, a transparent substrate, such as a glass substrate, can be used as a substrate for the small-size panel. In such an instance, the glass substrate may define a light-exiting side of the device, so that a light emitted from the EL element exits the device through the glass substrate. The large-size support facing toward the EL elements is then located opposite to the light-exiting side of the device.

In general, an electrode of the EL element placed on the light exiting side is a transparent electrode such as of ITO. Another electrode such as of a metal film is placed on the opposite side. This metal film electrode is opaque and reflects a light in a manner unique to a metal surface. Accordingly, the region where there is a metal electrode provides a different appearance from the region where there is no metal film electrode. Such an uneven appearance can be improved with the use of a large-size support made of a metal or having a metallic film laminated on its attachment side, whereby a metal surface is provided even in regions where there is no metal film electrode. Particularly, the presence of such a metallic support or metallic film at gaps created between neighboring small-size panels reduces the difference in appearance of the joints between small size panels from the remaining regions.

In the first aspect, the large-size support may be made of transparent material. The use of large-size transparent support permits the involvement of an ultraviolet-curable adhesive layer. That is, an adhesive layer, prior to being cured, may be interposed between the plural small-size panels and the large-size transparent support to join them. The subsequent exposure of the adhesive layer, through the large-size transparent support, to an ultraviolet light source causes it to cure.

In the case where the large-size transparent support is employed, such a large-size transparent support may be located at the side of the device from which a light emitted from the EL element exits. That is, the ITO or other transparent electrode defining an uppermost layer of the EL element may be located to face the large-size transparent support so that a light from the EL element is caused to exit the device through the large-size transparent support.

It is generally preferred that the adhesive layer be provided to overlie an entire area of an attachment surface. However, in the case where the large-size support is located opposite to the light-exiting side of the device, the adhesive layer may be provided to overlie only a periphery of each small-size panel. In such a case, the peripherally-extending adhesive layer defines an interior space between the small-size panel and large-size support. The placement of a desiccant in such a space effectively reduces deterioration of the EL element that may be caused by the exposure to a moisture.

The EL display device in accordance with a second aspect of the present invention is characterized as being increased in size by securing plural small-size panels, each carrying plural EL elements on its substrate, to a large-size support by an adhesive layer which faces toward the substrate of each panel.

In the second aspect, the securement of plural small-size panels to the large-size support by the adhesive layer imparts sufficient structural strength to a resulting large surface-area display device. A variety of techniques exist for sealing the EL elements to thereby suppress their deterioration. For example, a sealing metal form, called a can, or the like may be attached in such a fashion to seal the EL elements from an ambient environment. Alternatively, a sealing substrate such as a glass substrate may be attached with the aid of a sealing resin to seal them. Other useful sealing techniques include deposition of a film of a sealing resin on the EL elements and securement of a sealing film to overlie the EL elements.

In the second aspect, a glass or other transparent substrate may be used for the substrate of each small-size panel. In such an instance, the display device may be configured such that a light emitted from the EL element exits through such a transparent substrate. In the case where a light emitted from the EL element is caused to exit the device through the transparent substrate, the large-size support secured in contact with the transparent substrate of each panel may also be rendered transparent such that a light emitted from the EL element exits the device through the transparent substrate and the large-size transparent support. In this case, the large-size transparent support preferably has a refractive index comparable in level to the transparent substrate of the small-size panel, i.e., within ±1% deviation from the refractive index of the transparent substrate.

In the second aspect, an antireflection film may be used for the large-size support. Such an antireflection film has been conventionally employed when a metal film defines a pixel electrode to reduce its reflection and thereby increase contrasts. The use of antireflection film for the large-size support thus simplifies a construction and configuration of the EL display device.

In the first and second aspects of the present invention, it is preferred that the neighboring small-size panels are additionally secured to each other at their opposing faces by an adhesive layer. Such adhesion of small-size panels at their opposing faces may be achieved either before or during they are secured to the large-size support.

Preferably, the adhesive layer interposed between the opposing faces of small-size panels include spacers. The inclusion of such spacers permits suitable adjustment of a distance between neighboring small-size panels, so that a spacing between adjacent two electrodes within one small-size panel can be adjusted equal in dimension to a spacing between adjacent two electrodes separated into neighboring small-size panels.

In accordance with the first and second aspects of the present invention, the small-size panel carrying the EL elements may also incorporates driving circuits for driving them or connections with an external driving circuit. Such construction permits the EL elements within one small-size panel to be driven via the driving circuits or connections provided in the same small-size panel and thus eliminates the need to provide interpanel connections for coupling scanning pixel electrodes and/or signal pixel electrodes between different small-size panels, thereby facilitating the size increase of a display device.

The method for fabrication of an EL display device in accordance with the present invention is characterized as comprising, in sequence, securing plural small-size panels, each carrying a circuit in each pixel region, to a large-size support, forming an electroluminescent element over the pixel region, and sealing every electroluminescent element.

In accordance with the present invention, plural small-size panels, each carrying a circuit (e.g., a TFT or other switching element) in each pixel region, are secured to a large-size support, resulting in the provision of a large-size display panel. This assures that a consistent quality of circuit can be formed in each pixel region of the small-size panel. The occurrence of circuit defects and other inconveniences can be markedly reduced compared to the case where all necessary circuits are directly formed on a large-size substrate.

In accordance with the present invention, the circuit formation can be accomplished over a small-size panel. This allows the use of low-temperature polycrystalline silicon prepared by crystalizing amorphous silicon, for example, in the formation of a TFT or other switching element circuit, and is particularly suited to the case where amorphous silicon is crystalized by laser annealing.

In the present invention, it is preferred to plug a gap, if formed between small-size panels subsequent to their securement to the large-size support. The provision of such a plug portion prevents the passage of a moisture into the sealed interior so that the deterioration of EL elements by the moisture is effectively prevented.

In the present invention, subsequent to securement of small-size panels to the large-size support, the EL elements are formed and then all sealed. While not particularly specified, sealing may be accomplished by attachment of a sealing member. In such an instance, a seat portion having an upper surface contiguous in level with a top surface of the aforementioned plug portion may preferably be provided to bear the sealing member.

Examples of useful sealing members include metallic forms as of aluminum and stainless steel, inorganic ceramic forms as of $SiO_2$ and $Al_2O_3$, and hydrophobic forms containing plastics or the like.

The aforementioned plug and seat portions can be formed of a negative photosensitive material by a photolithographic technique. Preferably, a passivation film may be provided to overlie such plug and seat portions to prevent passage of a moisture therethrough. Examples of useful passivation films include $SiO_2$, SiN, $Al_2O_3$ and AlN films. These films can be formed by a sputtering technique, for example.

Also, the provision of driving circuits for driving switching elements or connections with an external driving circuit in the common small-size panel eliminates the need to provide interpanel connections for electrically coupling pixel electrodes between separate small-size panels. As a result, the size increase of EL display devices can be accomplished in a more simplified fashion.

DESCRIPTION OF THE PREFERRED EMBODIMENTS

Figure 1:
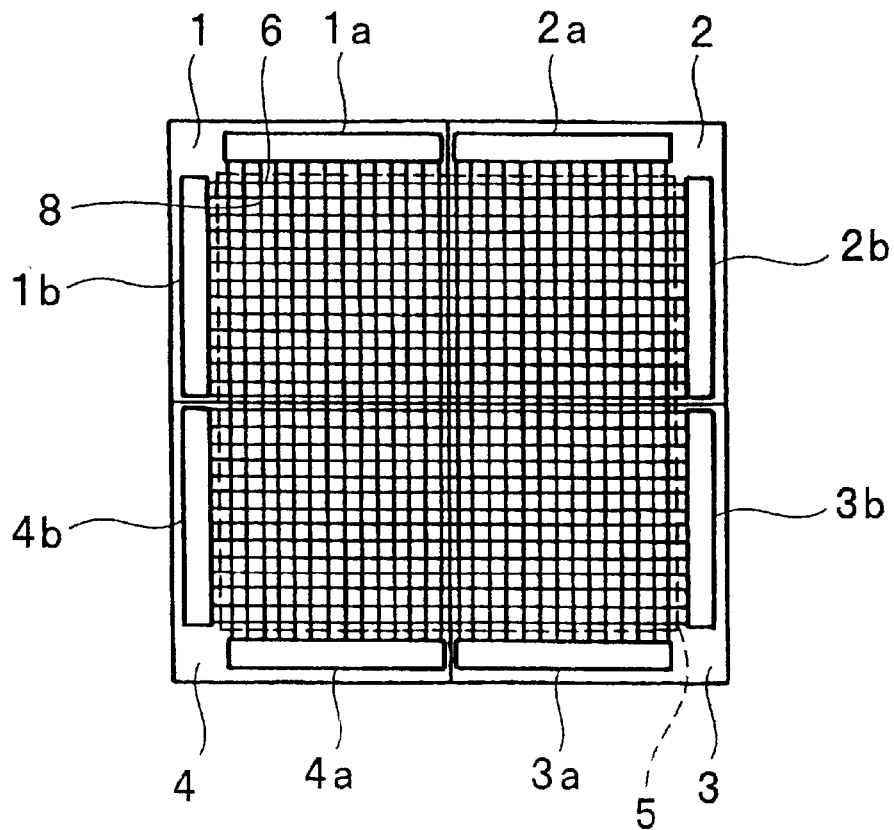
FIG. 1 is a plan view showing an organic EL display device embodiment in accordance with the first aspect of the present invention.
Figure 2:
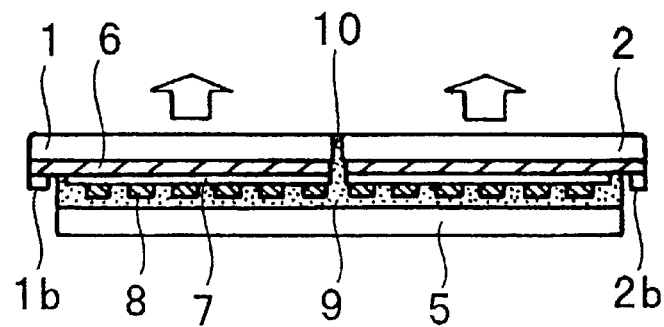
FIG. 2 is a sectional view of the device shown in FIG. 1.

FIGS. 1 and 2 are a plan view and a sectional view, respectively, illustrating one embodiment of an organic EL display device in accordance with the first aspect of the present invention. In this embodiment, four small-size panels 1–4 are secured to a large-size support 5 as shown in FIG. 1. Each of the small-size panels 1–4 carries an organic EL layer 7 interposed between two intersecting parallel sets of scanning pixel electrodes 6 and signal pixel electrodes 8, as shown in FIG. 2. Accordingly, an organic EL element is constituted in each of pixel regions defined at intersections of those two parallel sets of scanning pixel electrodes 6 and signal pixel electrodes 8.

Referring to FIG. 1, each small-size panel 1–4 carries driving circuits or connections 1b–4b to an external driving circuit for driving the scanning pixel electrodes 6, as well as driving circuits or connections 1a–4a to an external driving circuit for driving the signal pixel electrodes 8. A dotted line 5 is given in FIG. 1 to indicate a periphery of the large-size support 5.

FIG. 2 shows small-size panels when secured to the large-size support 5. As shown in FIG. 2, small-size panels 1, 2 are secured to the large-size support 5 by an adhesive layer 9 such that the EL elements thereon faces toward the large-size support 5. While not shown, the other small-size panels 3, 4 are also secured to the large-size support 5 in the same manner. As shown in FIG. 2, the small-size panels 1, 2 are also secured to each other at their opposing faces by an adhesive layer 10. Similarly, the small-size panels 3, 4 are secured to each other at their opposing faces by an adhesive layer 10. The adhesion of small-size panels at their opposing faces may be achieved either before they are secured to the large-size support 5 or concurrently with the adhesion thereof to the large-size support 5 using the same adhesive material.

As mentioned above, each small-size panel 1–4 carries driving circuits or connections to an external driving circuit for driving the scanning pixel electrodes 6 and signal pixel electrodes 8. Accordingly, the pixels within one small-size panel can be driven by the driving circuits or connections located in the same small-size panel. This eliminates the need to connect pixel electrodes to each other between different small-size panels. The pixels in all the small-size panels, when driven in a synchronized fashion, thus provide image display as if they are in a single large-size panel. However, the present invention is not limited to the above-described construction and configuration. For example, in the case where the number of small-size panels are further increased, any of them may be electrically coupled to each other.

In this particular embodiment, four small-size panels are combined to provide a large-size panel having a four-fold surface-area, as shown in FIG. 1. For example, a 20-inch VGA (640×480) display can be fabricated by combining four 10-inch small-size panel having 320×240 pixels arranged at a pitch of 600 $\mu$m.

In this embodiment, each small-size panel 1–4 has a glass or other transparent substrate at its one side. As indicated by the arrow given in FIG. 2, the display device is designed such that a light emitted from each organic EL element passes through the transparent substrate and exits the device. Accordingly, the large-size support 5 is located opposite to the light-exiting side of the panel.

Figure 3:
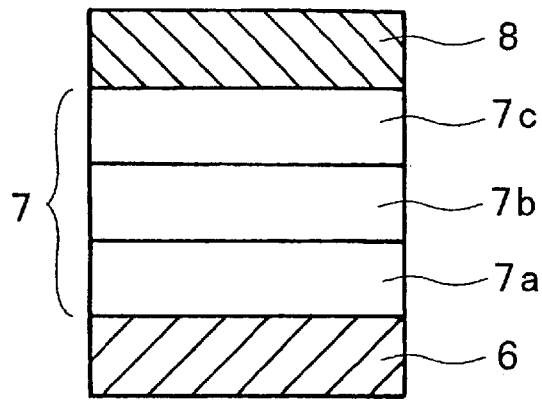
FIG. 3 is a sectional view showing an organic EL layer incorporated in the device.

FIG. 3 is a sectional view illustrating a structure of the organic EL element. In this embodiment, the scanning pixel electrode 6 is deposited to overlie a glass substrate (not shown in FIG. 3). The scanning pixel electrode 6 serves as a hole injecting electrode and can be formed from a 800 Å thick ITO (indium-tin oxide) film, for example. An organic EL medium 7 is provided overlying the scanning pixel electrode 6. The signal pixel electrode 8 is deposited over the organic EL medium 7 to extend in a direction transverse to the scanning pixel electrode 6. The signal pixel electrode 8 serves as an electron injecting electrode and can be formed from a 3,000 Å thick MgIn film, for example.

The organic EL medium 7 includes a hole transporting layer 7a in contact with the scanning pixel electrode 6, an electron transporting layer 7c in contact with the signal pixel electrode 8, and a luminescent layer 7b interposed between the hole transporting layer 7a and the electron transporting layer 7c. Specifically, the hole transporting layer 7a may be comprised of a 1,000 Å thick film of triphenylamine derivative (MTDATA) represented by the formula (1). The luminescent layer 7b may be comprised of a 200 Å thick film of diamine derivative (TPD), as represented by the formula (2), doped with 5 wt. % rubrene represented by the formula (3). The electron transporting layer 7c may be comprised of a 200 Å thick film of aluminium quinolinol chelate ($Alq_3$) represented by the formula (4). Each layer can be formed at a vacuum degree of $1\times10^{-6}$ Torr. by a vacuum deposition technique using a resistance heating board. The organic EL medium 7 such formed emits yellow light. The luminance achieves 200 cd/m$^2$ at a current density of 2 mA/cm$^2$ when the applied voltage is 5 V.

[Formula (1)]

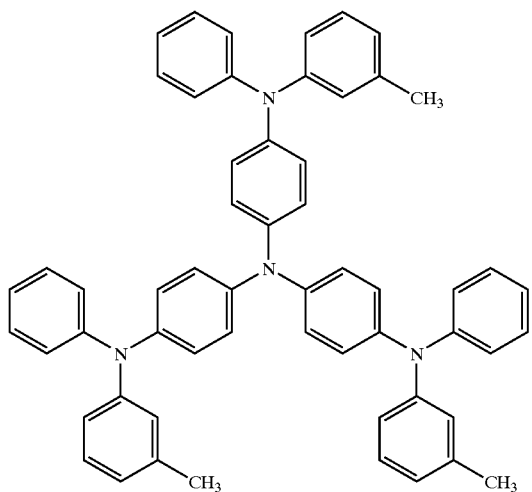

[Formula (2)]

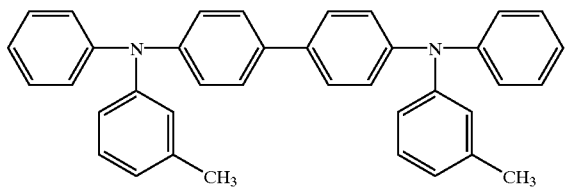

[Formula (3)]

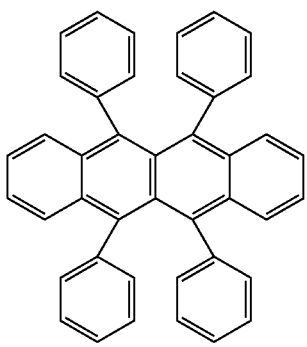

[Formula (4)]

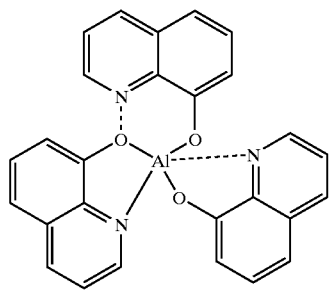

The following procedure can be utilized to secure the small-size panels 1–4 to the large-size support 5. An adhesive material is coated over an entire surface of each small-size panel 1–4, and/or over an entire surface of the large-size support 5, and on opposing faces of the small-size panels 1–4. The securement of the small-size panels to each other and to the large-size support is then carried out. Since organic EL elements undergo deterioration when exposed to a moisture, the securing operation is preferably carried out at a controlled atmosphere, e.g., under flow of nitrogen gas at a controlled temperature of not exceeding (dewpoint minus 70) °C. The viscosity of adhesive material preferably does not exceed 50,000 cps. The use of epoxy resin-based adhesives which show low moisture permeability is preferred for their ability to enhance a sealing effect. Preferably, the opposing faces of small-size panels are abrasion treated before they are secured to each other. Also, the adhesive material may contain a drying agent such as CaO.

Where the large-size support 5 is transparent, a UV-curable adhesive material can be used. In such a case, curing of the adhesive layer is achieved by exposure, via the transparent large-size support 5, to an ultraviolet radiation source.

The adhesive material may also contain spacers such as those for use in liquid crystal displays. The spacers are incorporated in the amount of about 5–10% by weight, for example. The inclusion of spacers in the adhesive material allows the coating of adhesive layer 10 shown in FIG. 2 to a predetermined thickness, so that neighboring small-size panels can be spaced apart by a predetermined distance. Imagine an exemplary case where the pixels within each small-size panel have a width of 100 $\mu$m and are arranged at a pitch of 600 $\mu$m and where the spacing of an outer edge of the small-size panel from the closest pixel is 200 $\mu$m. The use of spacers having a size of 100 $\mu$m permits the opposing faces of neighboring small-size panels to be spaced apart by a distance of 100 $\mu$m, resulting in the provision of a 600 $\mu$m spacing between any two adjacent pixels separated into the neighboring small-size panels, which spacing comes in agreement with the pitch of pixels within the same small-size panel.

The spacers may alternatively be incorporated in the adhesive layer 9. The inclusion of spacers in the adhesive layer 9 is effective in maintaining the desired spacing of small-size panels from the large-size support 5.

Preferably, the adhesive layer 10 interposed between neighboring small-size panels is transparent sufficient to show the close approximation to a refractive index (1.53, for example) of the glass substrate carried thereon.

The organic EL display device fabricated by securing the small-size panels to the large-size support according to the above-described procedure may be covered on its light-emitting side, i.e., over entire surfaces of transparent glass substrates carried on the small-size panels, with an antireflection film such as a circular polarizing film. The provision of such an antireflection film reduces the quantity of an external light to reflect at surfaces of the signal pixel electrodes 8 in the form of metallic films, thereby increasing contrasts.

The organic EL display device fabricated by securing the small-size panels to the large-size support according to the above-described procedure may be covered on its light-emitting side, i.e., over entire surfaces of transparent glass substrates carried on the small-size panels, with an antireflection film such as a circular polarizing film. Such an antireflection film reduces the quantity of external light that reflects at surfaces of the signal pixel electrodes 8 in the form of metallic films, thereby increasing the contrast of the display.

Figure 4:
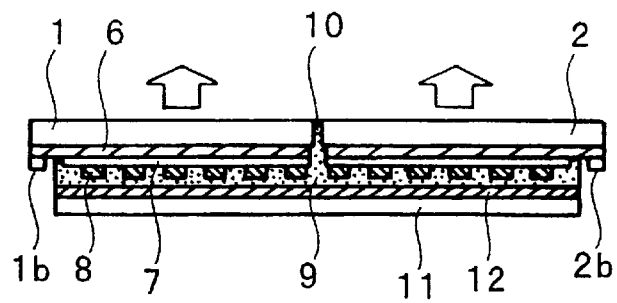
FIG. 4 is a sectional view showing another organic EL display device embodiment in accordance with the first aspect of the present invention.

FIG. 4 is a sectional view, illustrating another organic EL display device embodiment in accordance with the first aspect of the present invention. In this embodiment, a large-size support 11 carries thereon a metallic film 12 to which the organic EL element carrying sides of the small-size panels are secured. Otherwise, the display device is configured in the same manner as the preceding embodiment. In accordance with this embodiment, the presence of metallic film 12 even in regions left between neighboring signal pixel electrodes in the form of metallic films improves the otherwise uneven appearance. The presence of metallic film 12 also reduces distinction in appearance of joints between the small-size panels.

Figure 5:
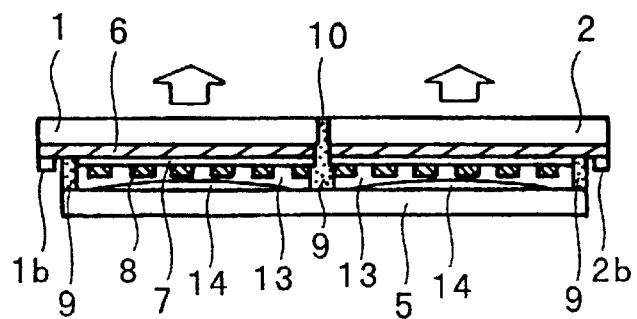
FIG. 5 is a sectional view showing still another organic EL display device embodiment in accordance with the first aspect of the present invention.

FIG. 5 is a sectional view, illustrating still another organic EL display device embodiment in accordance with the first aspect of the present invention. In this embodiment, the adhesive layer 9 is provided to extend along a periphery of each small-size panel where it is secured to the large-size support 5. Disposed within a space 13 surrounded by the peripherally extending adhesive layer 9 between each small-size panel and large-size support 5 is a drying agent 14 such as CaO or the like. The drying agent 14 may be retained by a porous film, for example. The accommodation of drying agent 14 within the space 13 protects the organic EL elements against deterioration by a moisture.

Figure 6:
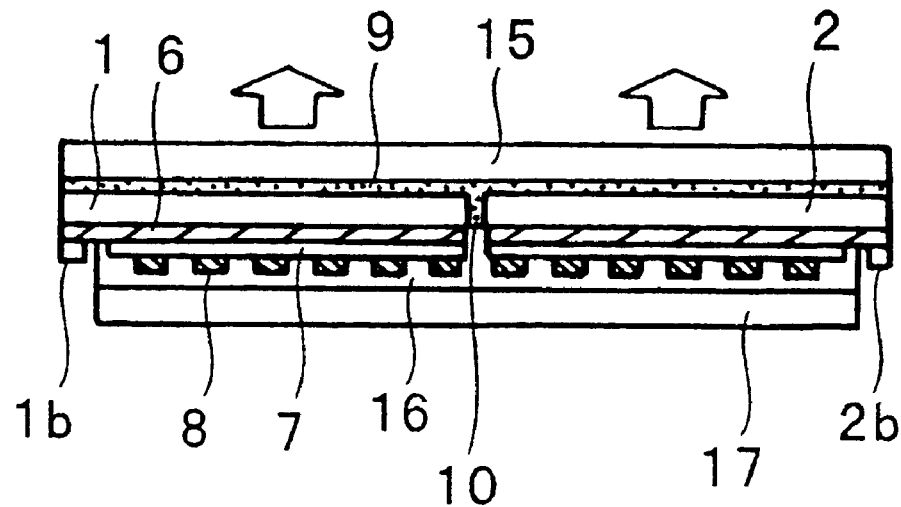
FIG. 6 is a sectional view showing an organic EL display device embodiment in accordance with the second aspect of the present invention.

FIG. 6 is a sectional view, illustrating an organic EL display device embodiment in accordance with the second aspect of the present invention. In this embodiment, each small-size panel 1, 2 is at its transparent substrate secured to the large-size support 15 by the adhesive layer 9. The large-size support 15 is made from a glass or other transparent material to transmit a light emitted from the organic EL element. Preferably, the large-size support 15 and adhesive layer 9 used are both transparent sufficient to show the close approximation to a refractive index (1.53, for example) of the transparent glass substrate of the small-size panel.

As similar to the preceding embodiment, the adhesive material may be coated over an entire surface of each small-size panel, and/or an entire surface of the large-size support 15, and opposing faces of neighboring small-size panels, where those small-size panels are secured to the large-size support 15. Preferably, the adhesive material used to form the adhesive layer 9 may also be utilized to apply the adhesive layer 10 between opposing faces of neighboring small-size panels.

The small-size panels are secured, on their sides carrying the EL elements, to a glass or other sealing support 17 by the intervening epoxy or other sealing resin 16. However, a technique of sealing the organic EL elements is not limited thereto. Other sealing techniques may also be used, including the attachment of sealing metal forms, such as cans, sealing films and sealing resins.

As such, the securement of small-size panels to the large-size support 15 in accordance with this embodiment assures structural strength sufficient for the organic EL elements to be sealed by various techniques. Also, the sealing of the organic EL elements can be achieved either before or after the small-size panels are secured to the large-size support.

Figure 7:
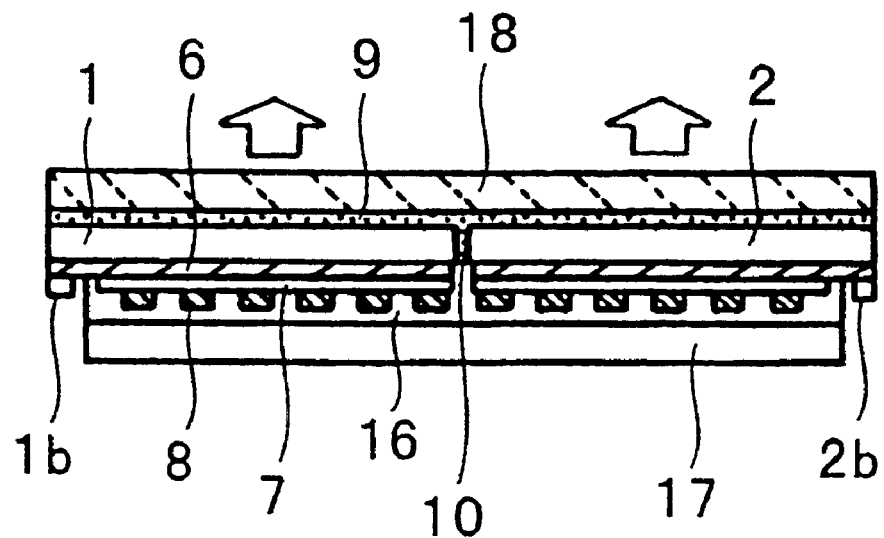
FIG. 7 is a sectional view showing another organic EL display device embodiment in accordance with the second aspect of the present invention.

FIG. 7 is a sectional view, illustrating another organic EL display device embodiment in accordance with the second aspect of the present invention. In this particular embodiment, the large-size support 18 is comprised of an antireflection film. In general, antireflection films have a thickness not exceeding 200 μm. However, the increase in thickness of a supporting film bearing an antireflection coating, e.g., to a thickness of 500 μm, enhances the strength of an antireflection film itself to the level sufficient for use as the large-size support of the present invention. The employment of such an antireflection film for the large-size support not only reduces reflection of external light but also increases contrast without the need to provide a separate antireflection film. In this embodiment, the sealing of the organic EL elements is established by the attachment of sealing support 17 with the aid of intervening sealing resin 16, as shown in FIG. 7. However, this sealing technique is not limiting. Various other sealing techniques such as those described above can also be employed.

In the preceding embodiments, the organic EL devices are decribed as being driven in a simple matrix mode. The present invention is not limited thereto and can be applied to organic EL display devices which incorporate a TFT or other switching element at each pixel and are driven in an active matrix mode.

In the preceding embodiments, the organic EL devices are described as including an organic EL layer overlying transparent electrodes deposited on a glass or transparent substrate and being designed to emit a light through a transparent substrate of a small-size panel. However, the present invention is not limited to such construction and configuration. The organic EL device shown in FIG. 2 can be modified such that it emits a light from the reverse side of the device, for example, by forming metal film electrodes on a small-size panel substrate, providing an organic EL medium incorporating the three layers shown in FIG. 3 but arranged in all reverse sequence to overlie the metal film electrodes, and depositing transparent electrodes on the organic EL medium. In this case, a transparent large-size support may be utilized to pass a light therethrough.

The preceding embodiments are described as applied to a yellow monochromatic image display. However, the present invention is not limited thereto, and can also be applied to a full color image display with RGB (red, green and blue) allocated to different pixels.

While the organic EL elements are utilized in the preceding embodiments, inorganic EL elements are also applicable to the present invention.

In accordance with the present invention, EL display devices are provided which have sufficient structural strength and which can be readily increased in size.

In accordance with the first aspect of the present invention, processes for combining small-size panels and for sealing of EL elements can be carried out in a simultaneous and simple fashion. Two substrates including a small-size panel substrate and a large-size support substantially determine the thickness dimensions the EL display devices. This permits construction of thin large-size displays.

In accordance with the second aspect of the present invention, size increase and structural reinforcement of EL display devices can be simultaneously accomplished by a configuration whereby plural small-size panels are secured to a large-size support. Various sealing techniques can be utilized to protect the EL elements against deterioration by moisture. Also, three substrates including a small-size panel substrate, a large-size support and a sealing substrate substantially determine the thickness dimensions of the EL display devices. This permits construction of thin large-size displays.

Figure 8:
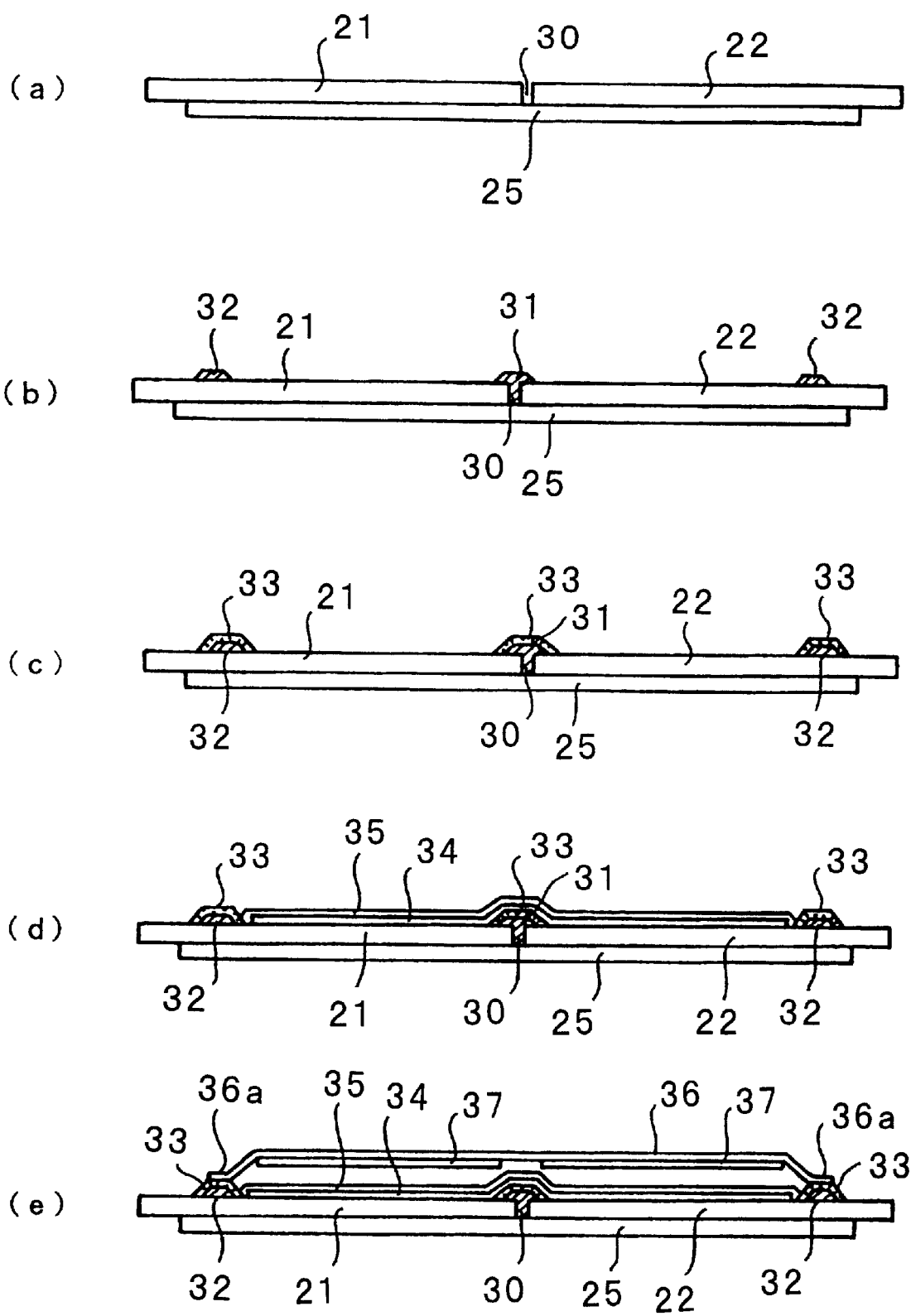
FIGS. 8(a)–8(e) are sectional views illustrating a series of processes for manufacturing an organic EL display device embodiment in accordance with the present invention.
Figure 11:
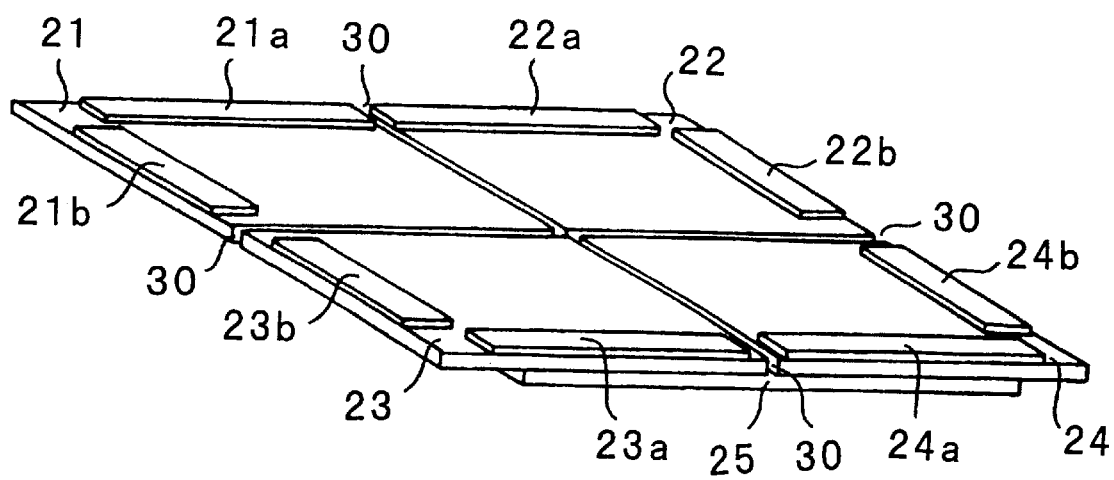
FIG. 11 is a perspective view showing small-size panels under the process shown in FIG. 8(a)

FIGS. 8(a)–8(b) illustrate one exemplary process for fabricating an EL display device. FIG. 8(a) shows plural small-size panels in the process of being secured to a large-size support. FIG. 11 is a perspective view showing plural small-size panels secured to a large-size support. Referring to FIG. 11, four small-size panels 21–24 are secured to a large-size transparent glass support 25. The small-size panels 21–24 include pixel areas. Located in each pixel area is a switching element in the form of a TFT. Specifically, amorphous silicon is deposited, in the form of a film, on each small-size panel and then crystalized by laser annealing into a low-temperature polycrystalline film. The TFT is formed utilizing this low-temperature polycrystalline film. The small-size panel also carries an ITO or other transparent electrode electrically coupled to both the switching element and a longitudinally-extending parallel set of signal pixel electrodes. The signal pixel electrodes arranged in each small-size panel 21, 22, 23, 24 are electrically coupled to a driving circuit or connection 21a, 22a, 23a, 24a to an external driving circuit. As shown in FIG. 11, each small-size panel 21, 22, 23, 24 also carries a driving circuit or connection 21b, 22b, 23b, 24b to an external driving circuit for driving a transversely-extending parallel set of scanning pixel electrodes.

FIG. 8(a) is a section taken along a transverse line passing through the small-size panels 21 and 22. While shown in FIG. 11, the driving circuits or connections are not shown in FIG. 8(a). An adhesive material is used to secure the small-size panels 21 and 22 and the large-size support 25. In the shown process, after a uniform coating of low-viscous acrylic adhesive has been applied over the large-size support 25, small-size panels are adhesively secured to the large-size support while adjusting their alignment. After completion of securement, baking is achieved, e.g., over a hot plate at 200° C. for 1 hour, to cure the adhesive. In the shown embodiment, each small-size panel is secured so that the driving circuits or connections 21a–24a and 21b–24b (shown in FIG. 11) thereon are located outside the securement region. This arrangement is suited to the case where each small-size panel carries the connections to an external driving circuit. However, the present invention is not limited to such arrangement. An entire surface of each small-size panel may be secured to the large-size support 25. The adjacent small-size panels, after secured to the large-size support 25, leave a space 30 therebetween, as shown in FIG. 8(a) and FIG. 11.

In the subsequent process as shown in FIG. 8(b), a plug portion 31 is provided to fill the space 30 and a seat portion 32 is provided in a region over each small-size panel for bearing a flange portion of a sealing member in the following process. Such plug and seat portions 31 and 32 can be formed of a negative resist. For example, the negative resist material is applied over an entire surface by spin coating, exposed to a light through a patterned mask and then developed to leave a resist coating in regions where the plug and seat portions 31 and 32 are to be located. Subsequent to being subjected to postbaking, the resist coating is baked at vacuum (5 Torr.) at 200° C. for 2 hours so that it is caused to cure.

Figure 9:
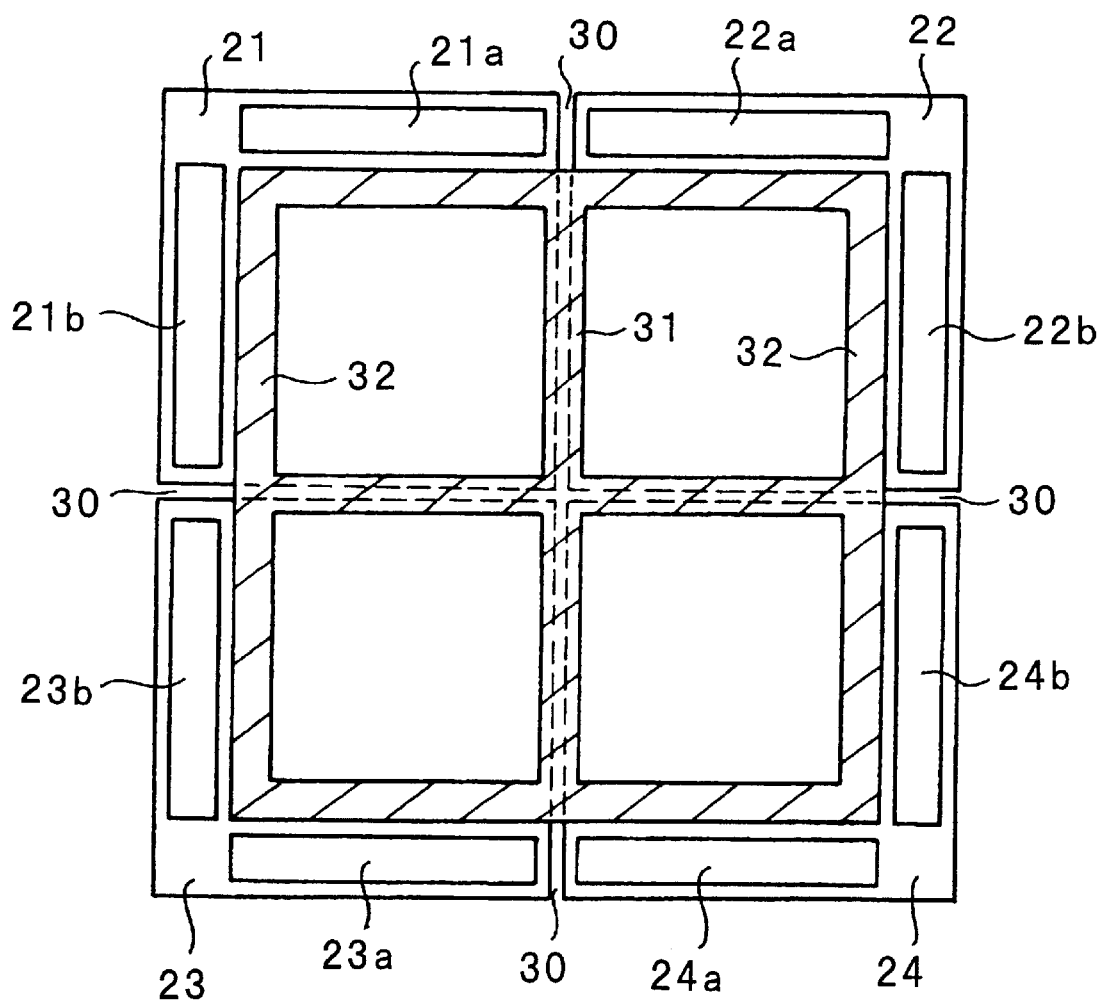
FIG. 9 is a plan view illustrating patterns of plug and seat portions in the device shown in FIG. 8.

FIG. 9 is a plan view showing the plug and seat portions 31 and 32 patterned in the manner as described above. As shown in FIG. 9, the plug portion 31 is formed in a cross pattern to extend along the space 30 between the opposing small-size panels. The seat portion 32 is formed in such a pattern as to receive a flange portion of the sealing member.

The formation of the plug and seat portions 31 and 32 from negative resist material, according to the present embodiment, prevents the TFT or other switching elements from being exposed to an ultraviolet light. As a result, driving parts such as switching elements are less damaged.

In this embodiment, curing of the resist coating is achieved by baking at vacuum at 200° C. However, a similar result can be obtained if baked in a nitrogen atmosphere.

As shown in FIG. 8(c), the next process involves formation of a passivation film 33 over the plug and seat portions 31 and 32. Illustrating a procedure of forming the passivation film 33, a positive resist material is applied over an entire surface by spin coating, prebaked, exposed to a light through the same patterned mask as used in the formation of plug and seat portions 31 and 32, and then developed to leave a positive coating in regions excepting the plug and seat portions 31 and 32. Subsequently, $SiO_2$ is deposited, in the form of a film having a thickness of 2,000 Å, on the entire surface by a sputtering technique. The positive resist is then removed by an organic etchant, so that the passivation film 33, in the form of the $SiO_2$ film, is left to overlie the plug and seat portions 31 and 32 only.

In this embodiment, the passivation film is comprised of the $SiO_2$ film. Other useful passivation films include SiN, $Al_2O_3$ and Aln films. The passivation film can also be obtained with the use of silicon-containing negative spin coating.

Next, an organic EL medium 34 and a set of scanning pixel electrodes 35 are sequentially deposited in an area surrounded by the seat portion 32, as shown in FIG. 8(d).

Figure 10:
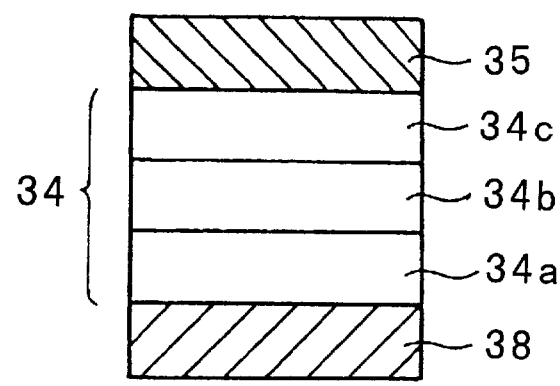
FIG. 10 is a sectional view showing an organic EL element incorporated in the device shown in FIG. 8.

FIG. 10 is a sectional view showing an organic EL element incorporating the organic EL medium 34. The organic EL medium 34 is disposed to overlie a transparent electrode 38 as comprised of an ITO (indium-tin oxide) film. The transparent electrode 38 may be disposed to overlie small-size panels either before or after they are secured to the large-size support. This embodiment follows the former. The transparent electrode 38 is electrically coupled to TFT or other switching elements previously carried on the small-size panels. Disposed on the transparent electrode 38 is a sequence of a hole transporting layer 34a, a luminescent layer 34b and an electron transporting layer 34c. The scanning pixel electrode 35, such as in the form of a MgIn film, is provided to overlie the electron transporting layer 34c.

As shown in FIG. 8(e), the EL element is subsequently sealed by fixedly placing a flange 36a of the sealing member 36 on the passivation film 33 overlying the seat portion 32 with the aid of an adhesive. The sealing member 36 defines an interior space within which a drying agent 37 is retained. The drying agent 37, such as CaO, may be retained in the space, for example, in the form of being interposed between the interior surface of the sealing member 36 and an additional porous film. The placement of drying agent 37 within a sealed interior space prevents deterioration of the EL medium. Preferably, the above procedure is performed at dry nitrogen atmosphere.

Figure 12:
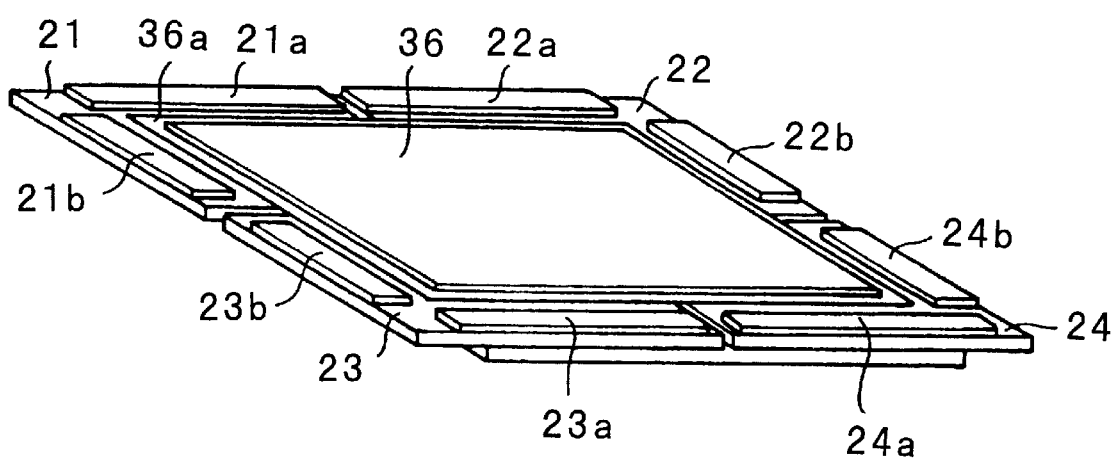
FIG. 12 is a perspective view showing a sealing member attached by the process shown in FIG. 8(e)

FIG. 12 is a perspective view showing the condition after establishment of sealing using the sealing member 36. In this embodiment, the plug portion 31 and seat portion 32 are configured to provide top surfaces contiguous in level with each other. This allows the uniform coating of adhesive on which the sealing member is to be placed, and accordingly perfects the sealing without leaving any gap between the sealing member and the adhesive coating. Also, the sealing of every organic EL element is accomplished by a single sealing member. This permits the increase in width of the flange 36a, i.e., the increase in width (sealing width) of the securement region. The increase of sealing width provides the effects which will be described below.

Figure 13:
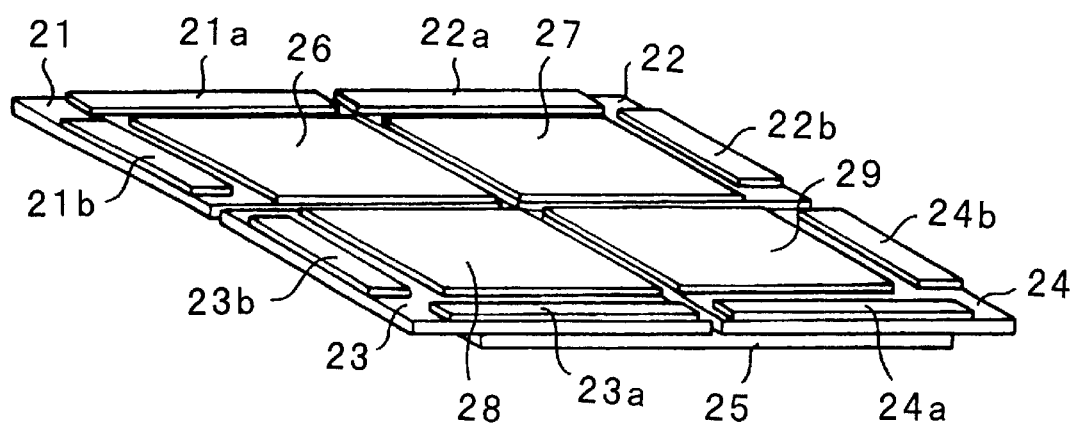
FIG. 13 is a perspective view showing a comparative organic EL display device.
Figure 14:
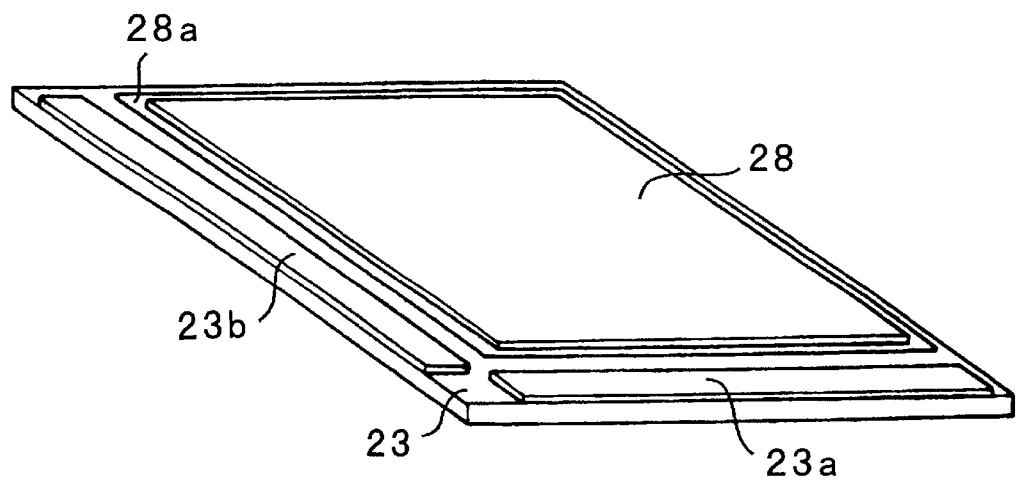
FIG. 14 is an enlarged perspective view showing one small-size panel incorporated in the comparative organic EL display device shown in FIG. 13.

FIG. 13 is a perspective view showing a comparative organic EL device. In this comparative embodiment, small-size panels 21, 22, 23 and 24 are individually sealed by respective sealing members 26, 27, 28 and 29. FIG. 14 is an enlarged perspective view showing one small-size panel 23. As shown in FIG. 14, sealing is accomplished by adhesion of the sealing member 28 at its flange 28a.

Figure 15:
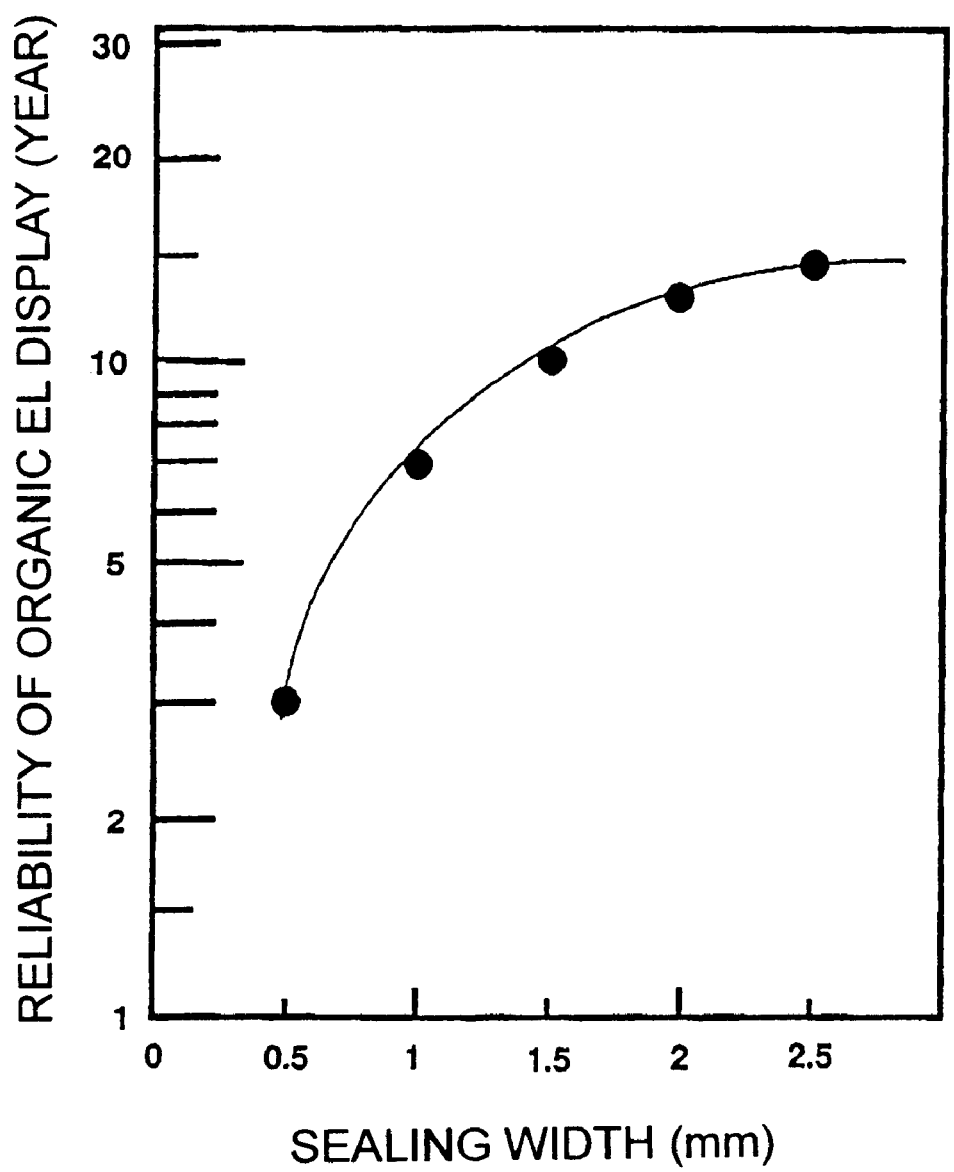
FIG. 15 is a graph showing a relationship between a sealing width created by a sealing member and reliability of an organic EL display device.

In the case where small-size panels are individually sealed by respective sealing members, as shown in FIG. 13, each sealing member must be secured at its flange. This leads necessarily to the reduction in width of the flange of each small-size panel. FIG. 15 is a graph showing the relationship between the flange width of sealing member, i.e., the sealing width, and the reliability of organic EL display device as referred to in terms of a period of time beyond which a luminous intensity of the organic EL display device deteriorates by 50%. As shown in FIG. 15, the reliability of organic EL display device increases as the sealing width increases. This is because the increasing sealing width prevents the passage of moisture into the sealed interior space more effectively. When sealing is achieved at each small-size panel, as shown in FIG. 13, the sealing width must be reduced. In contrary, when the sealing of every small-size panel is achieved by the use of a single sealing member as practiced in the aforementioned embodiment, the sealing width can be made larger leading to the increased reliability of organic EL display devices.

In the preceding embodiments, active-mode organic EL display devices are illustrated utilizing a TFT for a switching element. Passive-mode organic EL display devices can also be constructed which do not utilize a TFT. The display devices can also be constructed using inorganic EL elements although they are illustrated in the preceding embodiments as incorporating organic EL elements.

The present invention enables size increase of EL display devices if incorporating circuits that are unsuited for large surface-area formation, and is therefore suitable for size increase of EL display devices which incorporate a switching element in the form of a TFT formed of low-temperature polycrystalline silicon.

What is claimed is:

1. An electroluminescent display device including:
   plural small-size panels each incorporating plural electroluminescent elements on a substrate; and
   a large-size support to which said plural small-size panels are secured on surfaces of respective ones of said electroluminescent elements by an intervening adhesive layer.

2. The electroluminescent display device of claim 1, wherein said substrate of each said small-size panel is transparent.

3. The electroluminescent display device of claim 2, wherein said large-size support is located at a side of said device that does not pass a light emitted from said electroluminescent elements.

4. The electroluminescent display device of claim 3, wherein said large-size support is a metallic support or a support carrying a metallic film on a side thereof facing toward said small-size panels.

5. The electroluminescent display device of claim 3, wherein said adhesive layer is a peripherally-extending adhesive layer provided to extend along a periphery of each said small-size panel.

6. The electroluminescent display device of claim 5, further comprising a drying agent placed in a space surrounded by said peripherally-extending adhesive layer between said small-size panel and said large-size support.

7. The electroluminescent display device of claim 1, wherein said large-size support is transparent.

8. The electroluminescent display device of claim 7, wherein said large-size support is located at a side of said device that passes a light emitted from said electroluminescent element.

9. The electroluminescent display device of claim 7, wherein said adhesive layer is UV-curable.

10. The electroluminescent display device of claim 1, wherein opposing faces of neighboring ones of said small-size panels are also secured to each other by a second adhesive layer.

11. The electroluminescent display device of claim 10, wherein said second adhesive layer contains spacers.

12. The electroluminescent display device of claim 1, wherein said small-size panels carrying said electroluminescent elements also incorporate circuits for driving said electroluminescent elements or connections to an external driving circuit.

13. The electroluminescent display device of claim 1, wherein said electroluminescent elements are organic electroluminescent elements.

14. A method for fabricating the electroluminescent display device of claim 1, comprising the steps of:
   securing the plural small-size panels, each incorporating a circuit in each pixel region, to the large-size support;
   forming a respective one of the electroluminescent elements over each pixel region; and
   sealing every one of said electroluminescent elements.

15. The method of claim 14, wherein said circuit is a switching element.

16. The method of claim 15, wherein said switching element is comprised of a TFT.

17. The method of claim 16, wherein said TFT is formed from low-temperature polycrystalline silicon prepared by crystalizing amorphous silicon.

18. The method of claim 14, wherein, prior to the step of forming the electroluminescent element, a plug portion is provided to fill a gap produced between neighboring small-size panels when they are secured to the large-size support.

19. The method of claim 18, wherein the step of sealing every electroluminescent element is performed by attaching a sealing member.

20. The method of claim 19, wherein a seat portion having a top surface contiguous in level to a top surface of said plug portion is provided to extend over a region where said sealing member is attached.

21. The method of claim 20, wherein said seat portion is formed from a negative photosensitive material.

22. The method of claim 20, wherein a passivation film is provided to overlie said seat portion.

23. The method of claim 18, wherein said plug portion is formed from a negative photosensitive material.

24. The method of claim 18, wherein a passivation film is provided to overlie said plug portion.

25. The method of claim 14, wherein said small-size panel carrying the electroluminescent elements also incorporates circuits for driving the elements or connections to an external driving circuit.

26. The method of claim 14, wherein said electroluminescent element is an organic electroluminescent element.

27. An electroluminescent display device including:
   plural small-size panels each respectively incorporating plural electroluminescent elements on a single small-size substrate, without a second small-size substrate sandwiching said electroluminescent elements relative to said single small-size substrate; and
   a large-size support to which said single small-size substrate of each said small-size panel is secured by an intervening adhesive layer.

28. The electroluminescent display device of claim 27, wherein said single small-size substrate is transparent.

29. The electroluminescent display device of claim 28, wherein said large-size support is transparent and is located at a side of said device that passes a light emitted from said electroluminescent element.

30. The electroluminescent display device of claim 29, wherein said large-size support has a refractive index comparable in value to that of said transparent single small-size substrate of said small-size panel.

31. The electroluminescent display device of claim 29, wherein said large-size support comprises an antireflection film.

32. The electroluminescent display device of claim 27, wherein said large-size support is located at a side of said device that does not pass a light emitted from said electroluminescent elements.

33. The electroluminescent display device of claim 27, wherein opposing faces of neighboring ones of said small-size panels are also secured to each other by a second adhesive layer.

34. The electroluminescent display device of claim 33, wherein said second adhesive layer contains spacers.

35. The electroluminescent display device of claim 27, wherein said small-size panels carrying said electroluminescent elements also incorporate circuits for driving said electroluminescent elements or connections to an external driving circuit.

36. The electroluminescent display device of claim 27, wherein said electroluminescent elements are organic electroluminescent elements.

37. An electroluminescent display device comprising:

plural individual panels that each respectively include an individual substrate and plural electroluminescent elements mounted on a mounting surface of said individual substrate;

a single continuous support having an area size larger than a single one of said individual panels; and an adhesive;

wherein:

said plural individual panels are arranged with said individual substrates thereof oriented coplanar to each other and parallel to said single continuous support, with said mounting surface of said individual substrate of each of said individual panels facing toward said single continuous support, and with said electroluminescent elements of each of said individual panels received in a space directly between said single continuous support and said mounting surface of said individual substrate of each of said individual panels;

said adhesive directly contacts said single continuous support and said individual substrate of each one of said individual panels, and spans said space between said single continuous support and said mounting surface of said individual substrate of each one of said individual panels, so that said adhesive thereby adhesively bonds said plural individual panels to said single continuous support and seals said space to seal said electroluminescent elements between said individual substrates and said single continuous support; and said display device is a unitary sealed unit with said individual substrates of said individual panels forming a first outer side thereof, said single continuous support forming a second outer side thereof opposite said first outer side, and said adhesive sealing edges thereof that span between said first and second outer sides.

38. The electroluminescent display device according to claim 37, wherein said adhesive further fills, bonds and seals gaps between adjacent edges of neighboring ones of said individual substrates of said plural individual panels.

39. The electroluminescent display device according to claim 37, wherein said adhesive completely fills said space so that said electroluminescent elements are embedded and encapsulated in said adhesive.

40. The electroluminescent display device according to claim 37, wherein said adhesive surrounds and encloses space chambers in said space, and further comprising a desiccant material disposed in said space chambers.

41. The electroluminescent display device according to claim 37, wherein all of said plural individual panels together cover an area larger than said area size of said single continuous support, and portions of at least some of said individual panels laterally protrude and overhang beyond edges of said single continuous support.

* * * * *

UNITED STATES PATENT AND TRADEMARK OFFICE
CERTIFICATE OF CORRECTION

PATENT NO. : 6,624,570 B1
DATED : September 23, 2003
INVENTOR(S) : Nishio et al.

It is certified that error appears in the above-identified patent and that said Letters Patent is hereby corrected as shown below:

<u>Column 1,</u>
Line 25, after "returns", replace "toga" by -- to a --;

<u>Column 8,</u>
Lines 46 to 55, delete the whole paragraph;

<u>Column 9,</u>
Line 23, after "deterioration by", delete -- a --.

Signed and Sealed this

Tenth Day of February, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,624,570 B1
DATED : September 23, 2003
INVENTOR(S) : Nishio et al.

It is certified that error appears in the above-identified patent and that said Letters Patent is hereby corrected as shown below:

<u>Column 8,</u>
After line 65, insert the following:
-- The organic EL display device according to this embodiment operates when signals are applied to pixel electrodes via the driving circuits or connections 1a - 4a and 1b - 4b and serves as a large-size yellow monochromatic image display. In the organic EL display device of this embodiment, the small-size panels are secured, on their sides carrying the organic EL elements, to the large-size support by the adhesive layer. Accordingly, the securing process for panel size increase also serves as a process for sealing the organic EL elements. Also, the two substrates, i.e., the small-size panel substrate and the large-size support substantially determines thickness dimensions of EL display devices. This permits construction of thin large-size displays. --

Signed and Sealed this

Twenty-ninth Day of June, 2004

JON W. DUDAS
*Acting Director of the United States Patent and Trademark Office*